(12) United States Patent
Cao

(10) Patent No.: US 10,181,831 B2
(45) Date of Patent: Jan. 15, 2019

(54) LOUDSPEAKER DRIVING APPARATUS AND LOUDSPEAKER DRIVING METHOD

(71) Applicant: Silergy Semiconductor Technology (Hangzhou) LTD, Hangzhou, ZheJiang Province (CN)

(72) Inventor: Hejinsheng Cao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 15/800,458

(22) Filed: Nov. 1, 2017

(65) Prior Publication Data

US 2018/0138876 A1 May 17, 2018

(30) Foreign Application Priority Data

Nov. 17, 2016 (CN) .......................... 2016 1 1049808

(51) Int. Cl.
| | | |
|---|---|---|
| H04R 29/00 | (2006.01) | |
| H03G 3/20 | (2006.01) | |
| H04R 3/00 | (2006.01) | |
| H03G 3/30 | (2006.01) | |
| H04R 3/08 | (2006.01) | |

(52) U.S. Cl.
CPC ............. *H03G 3/20* (2013.01); *H03G 3/3005* (2013.01); *H04R 3/002* (2013.01); *H04R 3/007* (2013.01); *H04R 3/08* (2013.01); *H04R 29/001* (2013.01); *H04R 29/003* (2013.01)

(58) Field of Classification Search
CPC ...... H04R 29/001; H04R 29/003; H04R 9/02; H04R 2209/022; H04R 3/007; H04R 3/002

USPC ................................... 381/55, 83, 93, 58–59
See application file for complete search history.

(56) References Cited

U.S. PATENT DOCUMENTS

| | | | |
|---|---|---|---|
| 7,005,865 B2 | 2/2006 | Yakabe et al. | |
| 8,525,529 B2 | 9/2013 | Ishizeki et al. | |
| 9,674,593 B2* | 6/2017 | Gautama | H04R 1/00 |
| 9,716,954 B2 | 7/2017 | Cao | |
| 2011/0228945 A1* | 9/2011 | Mihelich | H04R 3/002 381/59 |
| 2013/0251164 A1* | 9/2013 | Gautama | H04R 29/001 381/59 |
| 2014/0169571 A1* | 6/2014 | Polleros | H04R 3/007 381/55 |
| 2015/0208189 A1* | 7/2015 | Tsai | H04R 29/001 381/59 |
| 2015/0319529 A1* | 11/2015 | Klippel | H04R 3/007 381/55 |
| 2017/0353795 A1* | 12/2017 | Hu | H04R 29/003 |

* cited by examiner

*Primary Examiner* — Disler Paul
(74) *Attorney, Agent, or Firm* — Michael C. Stephens, Jr.

(57) ABSTRACT

A speaker driving apparatus can include: a sound pressure feedback unit configured to generate an electrical signal indicative of a sound pressure of a loudspeaker; a compensation unit configured to compensate an input audio signal according to the electrical signal indicative of the sound pressure of the loudspeaker to generate a compensated audio signal, where the sound pressure of the loudspeaker is linearly related to the input audio signal; and an amplification unit configured to amplify the compensated audio signal in order to drive the loudspeaker.

8 Claims, 3 Drawing Sheets

LOUDSPEAKER DRIVING APPARATUS AND LOUDSPEAKER DRIVING METHOD

RELATED APPLICATIONS

This application claims the benefit of Chinese Patent Application No. 201611049808.4, filed on Nov. 17, 2016, which is incorporated herein by reference in its entirety.

FIELD OF THE INVENTION

The present disclosure generally relates to the field of acoustics, and more particularly to loudspeaker driving apparatuses and methods.

BACKGROUND

As the volumes of electronic products and loudspeakers continue to decrease, the non-linear nature of the loudspeaker is becoming more and more prominent. In order to ensure output quality in typical audio driving circuits, the input signals for the driving node are can be feedback to the control loop. Since the loudspeaker itself is a non-linear device, the audio signal input to the loudspeaker, and the sound pressure output by the loudspeaker, have a non-linear relationship. Thus, it is difficult to accurately control the sound pressure when conventional audio driving circuits are designed based on a linear relationship between the audio signal and the sound pressure. In one example, for a signal with a sound pressure of 10, the current amplitude of the input audio signal (e.g., an electrical signal) is 1, and an amplification circuit is generally employed to amplify the input audio signal by 10 times for the loudspeaker. Because the relationship between the input electrical signal and the output sound pressure of the loudspeaker is not linear, the output sound pressure that is finally obtained may deviate from an expected value.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In one embodiment, a speaker driving apparatus can include: (i) a sound pressure feedback unit configured to generate an electrical signal indicative of a sound pressure of a loudspeaker; (ii) a compensation unit configured to compensate an input audio signal according to the electrical signal indicative of the sound pressure of the loudspeaker to generate a compensated audio signal, where the sound pressure of the loudspeaker is linearly related to the input audio signal; and (iii) an amplification unit configured to amplify the compensated audio signal in order to drive the loudspeaker.

Figure 1:
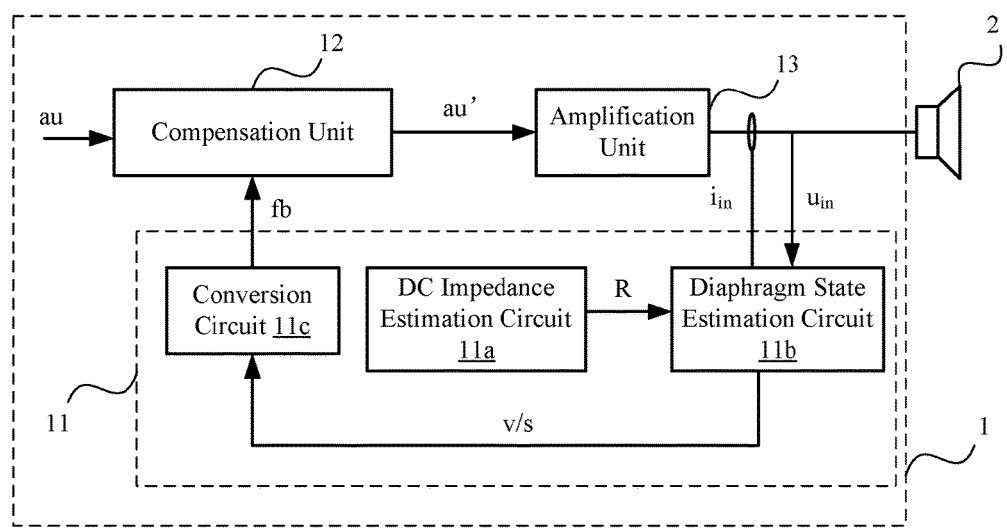
FIG. 1 is a schematic block diagram of an example loudspeaker driving apparatus, in accordance with embodiments of the present invention.

Referring now to FIG. 1, shown is a schematic block diagram of an example loudspeaker driving apparatus, in accordance with embodiments of the present invention. In this particular example, loudspeaker driving apparatus 1 can include sound pressure feedback unit 11, compensation unit 12, and amplification unit 13. Sound pressure feedback unit 11 can obtain an electrical signal indicative of the sound pressure of the loudspeaker. For example, sound pressure feedback unit 11 may not be dependent on the measurement, but rather can obtain the electrical signal indicative of the sound pressure of the loudspeaker by estimating the state of the loudspeaker according to input current $i_{in}$ and driving voltage $u_{in}$ of the loudspeaker generated by amplification unit 13.

Compensation unit 12 can receive input audio signal au and electrical signal fb that indicates the sound pressure of the loudspeaker that is feedback by sound pressure feedback unit 11. Compensation unit 12 can compensate the input audio signal au according to electrical signal fb indicating of the sound pressure of the loudspeaker, and output compensated audio signal au' (e.g., an electrical signal), such that the sound pressure of the loudspeaker is linearly related to the input audio signal. Amplification unit 13 can amplify the compensated input audio signal au' and output the amplified signal to the loudspeaker. Thus, a closed control loop based on the sound pressure can be formed in order to accurately control the output sound pressure.

In particular embodiments, by estimating an output pressure of a loudspeaker based on an input current and a driving voltage of the loudspeaker, and feeding back an electrical signal indicative of the sound pressure of the loudspeaker to an audio processing circuit, such that the output sound pressure is linearly related to an input audio signal by compensating the input audio signal according to the electrical signal, accurate control the output of the loudspeaker can be obtained. For example, sound pressure feedback unit 11 can generate an electrical signal indicative of the sound pressure of the loudspeaker.

Figure 2:
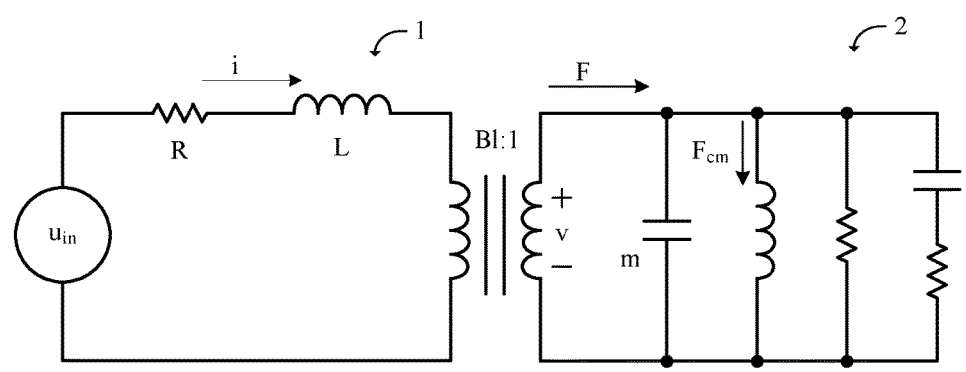
FIG. 2 is a schematic block diagram of an example electromagnetic and mechanical vibration model of a loudspeaker, in accordance with embodiments of the present invention.

Referring now to FIG. 2, shown is a schematic block diagram of an example electromagnetic and mechanical vibration model of a loudspeaker, in accordance with embodiments of the present invention. In this example, the diaphragm of the loudspeaker vibrates and produces sound under the driving of an electromagnetic field that is generated by an electromagnetic coil. Here, loop 1 is an equivalent circuit of a driving coil, $u_{in}$ is a driving voltage (e.g., an input voltage of the driving coil or voice coil), R is a resistance of the driving coil (e.g., a DC impedance of the loudspeaker), and L is an inductance of the driving coil and the total length thereof is 1. Also, Bl may denote the magnetic induction intensity in the gap between a magnet of the driving coil and a magnet of the diaphragm. That is, when the driving coil is not energized, the magnet induction intensity in the magnetic pole gap between a permanent magnet of the driving coil and a permanent magnet of the diagram is a substantially constant value. Further, i is a current in loop 1 (e.g., a current flowing through the driving coil), and v is a coupling voltage at the driven side.

Loop 2 is an equivalent model of a mechanical vibration system coupling with the driving coil. Also, different parameters in the mechanical mechanics system may be equivalent to one or more circuit components. Electromagnetic induction force F can be generated by induction voltage $u_{in}$, and may be equivalent to the current in loop 2. The quality of the mechanical vibration system, the force of the diaphragm, and the damping of the mechanical vibration system may have different properties for the applied force, which can be equivalent to the parallel capacitance, inductance and resistance.

Thus, the relationship between input current i, driving voltage $u_{in}$, diaphragm speed v, and diaphragm displacement s can satisfy the below formula:

$$\begin{cases} Ri + L\frac{di}{dt} + Blv = u_{in} \\ m\frac{dv}{dt} + R_m v + ks = Bli \\ \frac{ds}{dt} = v \end{cases}$$

Here, m is the diaphragm quality of the loudspeaker, $R_m$ is the mechanical damping of the loudspeaker, and k is an elastic coefficient of the diaphragm. If the model of the above formula is directly used in order to estimate the diaphragm displacement, the computation can be relatively complex due to the number of parameters that are required. In addition, Bl is a non-linear parameter of relatively poor stability, and is utilized above in order to model an electric-mechanical system and a mechanical-sound system of the loudspeaker when conducting a computation process.

Since the inductor mainly responds to the high-frequency AC current and the effect on driving voltage $u_{in}$ can be neglected, the factor related to the inductor can be omitted in the model. Also, non-linear parameter Bl is 1 through per-unit processing by neglecting its non-linear characteristic. Accordingly, the corresponding displacement may be converted to a relative displacement parameter after the non-linear portion of the model is neglected. Thus in particular embodiments, the diaphragm displacement model can be obtained as shown in the below formulas:

$$\begin{cases} R \cdot i(k) + v(k) = u(k) \\ v(k+1) = a \cdot i(k) + (1-b) \cdot v(k) + c \cdot s(k) \end{cases}$$

In the above formula, a, b, and c are weight values of the model, and s(k) is the diaphragm relative displacement at the moment k. In this way, a loudspeaker model expression can be obtained. In the above formula, DC impedance R of the loudspeaker is a predetermined value, which can be obtained by any suitable approaches or estimation. The DC impedance R in the model is thus a known value, and does not need to be obtained through the iteration of the model.

The input current, the loudspeaker diaphragm relative speed and relative displacement obtained by estimation can be configured as inputs, and the driving voltage of the loudspeaker may be configured as an output. Three weight values of the displacement model may be adjusted through adaptive filtering, until error e between estimated value $u_e$ of the driving voltage and measured value $u_d$ of the driving voltage converges (e.g., is less than a predetermined threshold). In this way, the diaphragm displacement model corresponding to the current weight value can accurately simulate the state of the loudspeaker. The model can also be adapted for further estimating the diaphragm speed. For example, the weight values a, b and c of the above model may be adjusted through adaptive filtering until error e between estimated value $u_e$ of the driving voltage and measured value $u_d$ of the driving voltage converges.

After successfully training the model, the diaphragm speed at the next moment can be predicted according to the finally determined weight values a, b and c and the above formula. The electrical signal indicative of the sound pressure of the loudspeaker can be generated by calculating the sound pressure of the loudspeaker based on the obtained diaphragm speed. That is to say, sound pressure feedback unit 11 initially estimates the DC impedance R of the loudspeaker, and secondly estimates the diaphragm speed of the loudspeaker according to the input current, the driving voltage, and the DC impedance. In this way, an electrical signal indicative of the sound pressure of the loudspeaker can be determined according to the diaphragm speed.

Referring also back to FIG. 1, sound pressure feedback unit 11 can include DC impedance estimation circuit 11*a*, diaphragm state estimation circuit 11*b*, and conversion circuit 11*c*. DC impedance estimation circuit 11*a* can estimate the DC impedance of the loudspeaker by any suitable approach. Those skilled in the art will recognize that the parameters can be obtained by any suitable approach for obtaining the DC impedance of the loudspeaker (e.g., through measurement, calculation, etc.).

Diaphragm state estimation model 11*b* can obtain a diaphragm displacement model of the loudspeaker according to the DC impedance, the input current, and the driving voltage of the loudspeaker, and may estimate the diaphragm speed of the loudspeaker based on the diaphragm displacement model. For example, diaphragm state estimation model 11*b* can effectively train the diaphragm displacement model based on the formula as described above and a corresponding approach, and may estimate the diaphragm speed based on the finally determined model. In particular embodiments, the diaphragm speed can be predicted such that the parameters of the model to be adjusted may be reduced in order to quickly train a stable, and to accurately predict the diaphragm speed while on-line.

Conversion model 11*c* can obtain the electrical signal indicative of the sound pressure of the loudspeaker according to an estimated value of the diaphragm speed of the loudspeaker. For example, the conversion model can generate an electrical signal indicative of the sound pressure of the loudspeaker according to a difference between the predicated diaphragm speed at the next moment and the diaphragm speed at the previous moment. For example, the "sound to electricity" conversion can be realized according to the following formula:

$p(k) = d \cdot (v(k+1) - v(k-1))$ $p_{in}(k) = mp \cdot p(k)$ $u_{in}(k) = mu \cdot u(k)$ Here, p(k) is an estimated value of the absolute sound pressure at the present moment, v(k+1) is an estimated value of the diaphragm speed at the next moment, v(k−1) is a diaphragm speed at the previous moment, and d is a calculation parameter obtained according to the area, size, and sampling time of the loudspeaker. Also, mp is a relative or relational coefficient for converting the absolute sound pressure to relative sound pressure, and mu is a relative relational coefficient that converts an absolute driving voltage to a relative driving voltage. This can be obtained according to the relevant parameters of the loudspeaker and the magnification of the amplifying unit. In addition, after pin(k) is obtained by the conversion model, pin(k) can be multiplied by a feedback coefficient k such that the amplitude of the electrical signal indicative of the sound pressure is adapted for the compensation operation of compensation unit 12.

In particular embodiments, the estimated value of the diaphragm displacement can be used to estimate the present sound pressure. Those skilled in the art will recognize that other approaches for estimating the states of the loudspeaker can be employed in order to estimate the diaphragm speed, or other approaches for obtaining the sound pressure can be employed in order to obtain the output sound pressure of the loudspeaker. When the input audio signal is a current signal (e.g., the loudspeaker is driven by a current), compensation unit 12 can compensate the input audio signal in current form according to the electrical signal indicative of the sound pressure (e.g., a voltage signal or a current signal), and may provide a current signal such that the sound pressure is proportional to the input audio signal. The signal can be amplified by amplification unit 13, and provided to loudspeaker 2.

When the input audio signal is a voltage signal (e.g., the loudspeaker is driven by a voltage), compensation unit 12 can compensate the input audio signal in the voltage form according to the electrical signal indicative of the sound pressure, and can provide a voltage signal such that the sound pressure is proportional to the input audio signal. The signal can be amplified by amplification unit 13, and provided to loudspeaker 2.

For example, compensation unit 12 can calculate the error value between the feedback electrical signal and the input audio signal, and may compensate the error value such that the feedback signal is proportional to or linearly related to the input audio signal. In certain embodiments, sound pressure feedback unit 11 and compensation unit 12 can be implemented by combining a digital circuit or a general processor for executing a predetermined process with an analog-to-digital converter (ADC) and a digital-to-analog converter (DAC). Amplification unit 13 can be an analog amplification circuit, or a digital amplification circuit.

In one embodiment, a loudspeaker driving method can include: (i) generating an electrical signal indicative of a sound pressure of a loudspeaker; (ii) compensating an input audio signal according to the electrical signal indicative of the sound pressure of the loudspeaker to generate a compensated audio signal, where the sound pressure of the loudspeaker is linearly related to the input audio signal; and (iii) amplifying the compensated input audio signal for driving the loudspeaker.

Figure 3:
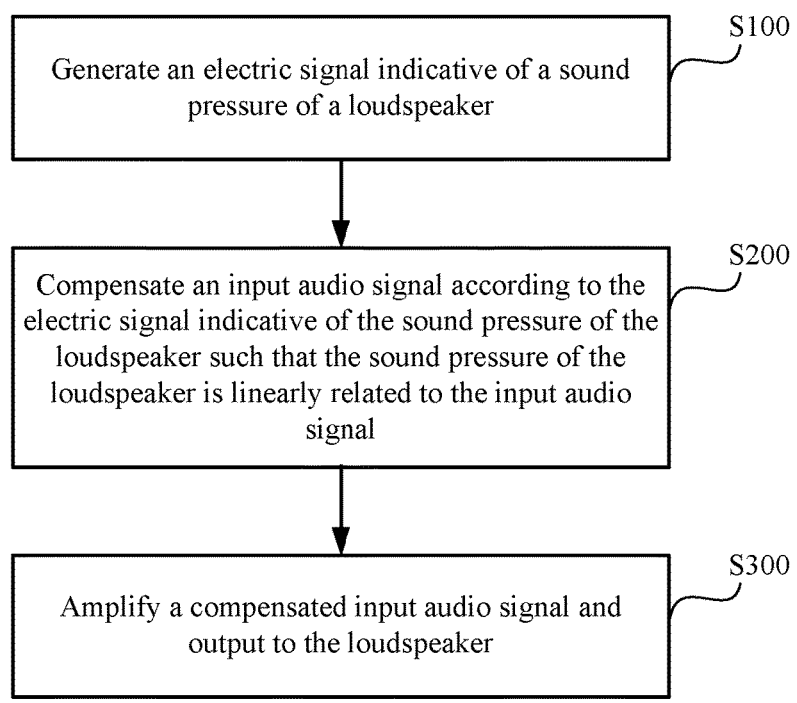
FIG. 3 is a flow diagram of an example loudspeaker driving method, in accordance with embodiments of the present invention.

Referring now to FIG. 3, shown is a flow diagram of an example loudspeaker driving method, in accordance with embodiments of the present invention. In this particular example, at S100, an electrical signal indicative of a sound pressure of a loudspeaker can be generated. For example, the electrical signal indicative of the sound pressure of the loudspeaker can be obtained according to an input current and a driving voltage of the loudspeaker generated by an amplification circuit. For example, S100 can include estimating a DC impedance of the loudspeaker, and estimating the diaphragm speed of the loudspeaker according to the input current, the driving voltage, and the DC impedance.

For example, estimating the diaphragm speed of the loudspeaker can include obtaining a diaphragm displacement model of the loudspeaker according to the DC impedance, the input current, and the driving voltage of the loudspeaker, and estimating the diaphragm speed of the loudspeaker based on the diaphragm displacement model. For example, this can include updating weight values and training the diaphragm displacement model based on the following formulas with a target of minimizing an estimated value of the driving voltage and a measured value of the driving voltage:

$$\begin{cases} R \cdot i(k) + v(k) = u(k) \\ v(k+1) = a \cdot i(k) + (1-b) \cdot v(k) + c \cdot s(k) \end{cases}$$

Here, R is the DC impedance of the loudspeaker, i(k) is the input current at moment k, v(k) is an estimated value of the diaphragm relative speed at moment k, u(k) is the estimated value of the driving voltage at moment k, s(k) is an estimated value of the diaphragm relative displacement at moment k, and a, b, and c are weight values corresponding to i(k), v(k) and s(k), respectively.

For example, S100 can also include generating the electrical signal indicative of the sound pressure of the loudspeaker according to a difference between the predicated diaphragm speed at the next moment and the diaphragm speed at the previous moment. For example, the electrical signal indicative of the sound pressure of the loudspeaker can be generated according to a product of the difference, a predetermined calculation parameter, and a feedback coefficient. At S200, the input audio signal can be compensated according to the electrical signal indicative of the sound pressure of the loudspeaker, such that the sound pressure of the loudspeaker is linearly related to the input audio signal. At S300, a compensated input audio signal can be amplified, and provided to the loudspeaker.

Particular embodiments can include an apparatus for estimating an output pressure of a loudspeaker based on an input current and a driving voltage of the loudspeaker, and feeding back an electrical signal indicative of the sound pressure of the loudspeaker to an audio processing circuit, such that the output sound pressure is linearly related to an input audio signal by compensating the input audio signal according to the electrical signal. In this way, the output of the loudspeaker can be accurately controlled.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:
1. A speaker driving apparatus, comprising:
 a) a sound pressure feedback unit configured to generate an electrical signal indicative of a sound pressure of a loudspeaker according to an input current and a driving voltage of said loudspeaker from an amplification unit;
 b) a compensation unit configured to compensate an input audio signal according to said electrical signal indicative of said sound pressure of said loudspeaker to generate a compensated audio signal, wherein said sound pressure of said loudspeaker is linear to said input audio signal;

c) said amplification unit configured to amplify said compensated audio signal in order to drive said loudspeaker; and d) said sound pressure feedback unit being configured to estimate a DC impedance of said loudspeaker, estimate a diaphragm speed of said loudspeaker according to said input current, said driving voltage, and said DC impedance, and generate said electrical signal indicative of said sound pressure of said loudspeaker according a difference between a predicted diaphragm speed at a next moment and said diaphragm speed at a previous moment.

2. The apparatus of claim 1, wherein said sound pressure feedback unit comprises:

a) a DC impedance estimation circuit configured to estimate a DC impedance of said loudspeaker;

b) a diaphragm state estimation circuit configured to obtain a diaphragm displacement model of said loudspeaker according to said DC impedance, said input current, and said driving voltage of said loudspeaker, and to estimate said diaphragm speed of said loudspeaker based on said diaphragm displacement model; and c) a conversion circuit configured to generate said electrical signal indicative of said sound pressure of said loudspeaker according to an estimated value of said diaphragm speed or an estimated value of a diaphragm displacement of said loudspeaker.

3. The apparatus of claim 2, wherein said diaphragm state estimation model updates weight values for training said diaphragm displacement model according to:

$$\begin{cases} R \cdot i(k) + v(k) = u(k) \\ v(k+1) = a \cdot i(k) + (1-b) \cdot v(k) + c \cdot s(k) \end{cases}$$

wherein, R is said DC impedance of said loudspeaker, i(k) is said input current at moment k, v(k) is said diaphragm speed at moment k, u(k) is said estimated value of said driving voltage at moment k, s(k) is a diaphragm relative displacement, a, b and c are weight values corresponding to i(k), v(k) and s(k).

4. The apparatus of claim 1, wherein said electrical signal indicative of said sound pressure of said loudspeaker is generated according to a product of said difference, a predetermined calculation parameter, and a feedback coefficient.

5. A loudspeaker driving method, comprising:

a) estimating a DC impedance of a loudspeaker;

b) estimating a diaphragm speed of said loudspeaker according to an input current, a driving voltage, and said DC impedance;

c) generating an electrical signal indicative of a sound pressure of said loudspeaker according to a difference between a predicted diaphragm speed at a next moment and said diaphragm speed at a previous moment;

d) compensating an input audio signal according to said electrical signal indicative of said sound pressure of said loudspeaker to generate a compensated audio signal, wherein said sound pressure of said loudspeaker is linear to said input audio signal; and e) amplifying said compensated input audio signal for driving said loudspeaker.

6. The method of claim 5, wherein said estimating said diaphragm speed of said loudspeaker comprises:

a) obtaining a diaphragm displacement model of said loudspeaker by training said DC impedance, said input current, and said driving voltage of said loudspeaker; and b) estimating said diaphragm speed of said loudspeaker based on said diaphragm displacement model.

7. The method of claim 6, wherein said obtaining said diaphragm displacement model comprises:

$$\begin{cases} R \cdot i(k) + v(k) = u(k) \\ v(k+1) = a \cdot i(k) + (1-b) \cdot v(k) + c \cdot s(k) \end{cases}$$

wherein, R is said DC impedance of said loudspeaker, i(k) is said input current at moment k, v(k) is an estimated value of said diaphragm relative speed at moment k, u(k) is said estimated value of said driving voltage at moment k, s(k) is an estimated value of a diaphragm relative displacement, a, b and c are weight values corresponding to i(k), v(k) and s(k), respectively.

8. The method of claim 5, wherein said generating said electrical signal indicative of said sound pressure of said loudspeaker is according to a product of said difference, a predetermined calculation parameter, and a feedback coefficient.

* * * * *